(12) United States Patent
Tsuchi

(10) Patent No.: US 12,406,638 B2
(45) Date of Patent: Sep. 2, 2025

(54) DIGITAL-TO-ANALOG CONVERTER, DATA DRIVER, AND DISPLAY DEVICE

(71) Applicant: LAPIS Technology Co., Ltd., Yokohama (JP)

(72) Inventor: Hiroshi Tsuchi, Yokohama (JP)

(73) Assignee: LAPIS Technology Co., Ltd., Yokohama (JP)

( * ) Notice: Subject to any disclaimer, the term of this patent is extended or adjusted under 35 U.S.C. 154(b) by 0 days.

(21) Appl. No.: 18/644,049

(22) Filed: Apr. 23, 2024

(65) Prior Publication Data

US 2024/0363086 A1    Oct. 31, 2024

(30) Foreign Application Priority Data

Apr. 26, 2023   (JP) .................. 2023-072303

(51) Int. Cl.
| | | |
|---|---|---|
| G09G 3/36 | (2006.01) | |
| G09G 3/3275 | (2016.01) | |
| H03F 3/45 | (2006.01) | |
| H03M 1/06 | (2006.01) | |

(52) U.S. Cl.
CPC ......... *G09G 3/3688* (2013.01); *G09G 3/3275* (2013.01); *H03F 3/45183* (2013.01); *H03M 1/0682* (2013.01)

(58) Field of Classification Search
None
See application file for complete search history.

(56) References Cited

U.S. PATENT DOCUMENTS

| | | | |
|---|---|---|---|
| 2006/0028274 A1* | 2/2006 | Ishii | H03F 3/72 330/253 |
| 2011/0199366 A1* | 8/2011 | Tsuchi | G09G 3/3688 345/212 |
| 2013/0141474 A1* | 6/2013 | Kim | G09G 3/3275 341/145 |

FOREIGN PATENT DOCUMENTS

JP    2002043944    2/2002

* cited by examiner

*Primary Examiner* — Kirk W Hermann
(74) *Attorney, Agent, or Firm* — JCIPRNET

(57) ABSTRACT

The differential amplifier circuit includes: first conductivity type first to $N^{th}$ differential stages each causing a current corresponding to the first or second voltage received at the non-inverting input terminal to flow to a first node and a current corresponding to the output voltage signal received at the inverting input terminal to a second node; a second conductivity type differential stage receiving one of the first and second voltages at the non-inverting input terminal and receiving the output voltage signal at the inverting input terminal, and being activated when the digital data value is within a predetermined range to cause a current corresponding to the one voltage to flow to a third node and a current corresponding to the output voltage signal to a fourth node; and an output amplification stage generating the output voltage signal based on the currents respectively flowing to the first to fourth nodes.

11 Claims, 9 Drawing Sheets

| Level | Digital data | | | | | | | | Nch differential stage (N=4) | | | | Pch differential stage | Output voltage | |
|---|---|---|---|---|---|---|---|---|---|---|---|---|---|---|---|
| | D7 | D6 | D5 | D4 | D3 | D2 | D1 | D0 | VI_1 | VI_2 | VI_3 | VI_4 | VI_P | State | Vout |
| 0 | 0 | 0 | 0 | 0 | 0 | 0 | 0 | 0 | V0 | V0 | V0 | V0 | V0 | Inactive | V0 |
| 1 | 0 | 0 | 0 | 0 | 0 | 0 | 0 | 1 | V1 | V1 | V1 | V1 | V1 | | V1 |
| 2 | 0 | 0 | 0 | 0 | 0 | 0 | 1 | 0 | V2 | V2 | V2 | V2 | V2 | | V2 |
| 3 | 0 | 0 | 0 | 0 | 0 | 0 | 1 | 1 | V3 | V3 | V3 | V3 | V3 | | V3 |
| 4 | 0 | 0 | 0 | 0 | 0 | 1 | 0 | 0 | V4 | V4 | V4 | V4 | V4 | | V4 |
| 5 | 0 | 0 | 0 | 0 | 0 | 1 | 0 | 1 | V5 | V5 | V5 | V5 | V5 | | V5 |
| 6 | 0 | 0 | 0 | 0 | 0 | 1 | 1 | 0 | V6 | V6 | V6 | V6 | V6 | | V6 |
| 7 | 0 | 0 | 0 | 0 | 0 | 1 | 1 | 1 | V7 | V7 | V7 | V7 | V7 | | V7 |
| 8 | 0 | 0 | 0 | 0 | 1 | 0 | 0 | 0 | V7 | V11 | V7 | V7 | V7 | | V8 |
| 9 | 0 | 0 | 0 | 0 | 1 | 0 | 0 | 1 | V7 | V7 | V11 | V11 | V7 | | V9 |
| 10 | 0 | 0 | 0 | 0 | 1 | 0 | 1 | 0 | V7 | V11 | V11 | V11 | V7 | | V10 |
| 11 | 0 | 0 | 0 | 0 | 1 | 0 | 1 | 1 | V11 | V11 | V11 | V11 | V11 | | V11 |
| 12 | 0 | 0 | 0 | 0 | 1 | 1 | 0 | 0 | V11 | V15 | V11 | V11 | V11 | | V12 |
| 13 | 0 | 0 | 0 | 0 | 1 | 1 | 0 | 1 | V11 | V11 | V15 | V15 | V11 | | V13 |
| 14 | 0 | 0 | 0 | 0 | 1 | 1 | 1 | 0 | V11 | V15 | V15 | V15 | V11 | | V14 |
| 15 | 0 | 0 | 0 | 0 | 1 | 1 | 1 | 1 | V15 | V15 | V15 | V15 | V15 | | V15 |
| ⋮ | | | | | | | | | | | | | ⋮ | | |
| 240 | 1 | 1 | 1 | 1 | 0 | 0 | 0 | 0 | V239 | V243 | V239 | V239 | V239 | Inactive | V240 |
| 241 | 1 | 1 | 1 | 1 | 0 | 0 | 0 | 1 | V239 | V239 | V243 | V243 | V239 | | V241 |
| 242 | 1 | 1 | 1 | 1 | 0 | 0 | 1 | 0 | V239 | V243 | V243 | V243 | V239 | | V242 |
| 243 | 1 | 1 | 1 | 1 | 0 | 0 | 1 | 1 | V243 | V243 | V243 | V243 | V243 | | V243 |
| 244 | 1 | 1 | 1 | 1 | 0 | 1 | 0 | 0 | V243 | V247 | V243 | V243 | V243 | | V244 |
| 245 | 1 | 1 | 1 | 1 | 0 | 1 | 0 | 1 | V243 | V243 | V247 | V247 | V243 | | V245 |
| 246 | 1 | 1 | 1 | 1 | 0 | 1 | 1 | 0 | V243 | V247 | V247 | V247 | V243 | | V246 |
| 247 | 1 | 1 | 1 | 1 | 0 | 1 | 1 | 1 | V247 | V247 | V247 | V247 | V247 | | V247 |
| 248 | 1 | 1 | 1 | 1 | 1 | 0 | 0 | 0 | V248 | V248 | V248 | V248 | V248 | Active | V248 |
| 249 | 1 | 1 | 1 | 1 | 1 | 0 | 0 | 1 | V249 | V249 | V249 | V249 | V249 | | V249 |
| 250 | 1 | 1 | 1 | 1 | 1 | 0 | 1 | 0 | V250 | V250 | V250 | V250 | V250 | | V250 |
| 251 | 1 | 1 | 1 | 1 | 1 | 0 | 1 | 1 | V251 | V251 | V251 | V251 | V251 | | V251 |
| 252 | 1 | 1 | 1 | 1 | 1 | 1 | 0 | 0 | V252 | V252 | V252 | V252 | V252 | | V252 |
| 253 | 1 | 1 | 1 | 1 | 1 | 1 | 0 | 1 | V253 | V253 | V253 | V253 | V253 | | V253 |
| 254 | 1 | 1 | 1 | 1 | 1 | 1 | 1 | 0 | V254 | V254 | V254 | V254 | V254 | | V254 |
| 255 | 1 | 1 | 1 | 1 | 1 | 1 | 1 | 1 | V255 | V255 | V255 | V255 | V255 | | V255 |

FIG. 3

| Level | Digital data | | | | | | | | Nch differential stage (N=4) | | | | Pch differential stage | | Output voltage |
|---|---|---|---|---|---|---|---|---|---|---|---|---|---|---|---|
| | D7 | D6 | D5 | D4 | D3 | D2 | D1 | D0 | VI_1 | VI_2 | VI_3 | VI_4 | VI_P | State | Vout |
| 0 | 0 | 0 | 0 | 0 | 0 | 0 | 0 | 0 | V0 | V0 | V0 | V0 | V0 | Inactive | V0 |
| 1 | 0 | 0 | 0 | 0 | 0 | 0 | 0 | 1 | V1 | V1 | V1 | V1 | V0 | | V1 |
| 2 | 0 | 0 | 0 | 0 | 0 | 0 | 1 | 0 | V2 | V2 | V2 | V2 | V0 | | V2 |
| 3 | 0 | 0 | 0 | 0 | 0 | 0 | 1 | 1 | V3 | V3 | V3 | V3 | V0 | | V3 |
| 4 | 0 | 0 | 0 | 0 | 0 | 1 | 0 | 0 | V4 | V4 | V4 | V4 | V0 | | V4 |
| 5 | 0 | 0 | 0 | 0 | 0 | 1 | 0 | 1 | V5 | V5 | V5 | V5 | V0 | | V5 |
| 6 | 0 | 0 | 0 | 0 | 0 | 1 | 1 | 0 | V6 | V6 | V6 | V6 | V0 | | V6 |
| 7 | 0 | 0 | 0 | 0 | 0 | 1 | 1 | 1 | V7 | V7 | V7 | V7 | V0 | | V7 |
| 8 | 0 | 0 | 0 | 0 | 1 | 0 | 0 | 0 | V7 | V11 | V7 | V7 | V0 | | V8 |
| 9 | 0 | 0 | 0 | 0 | 1 | 0 | 0 | 1 | V7 | V7 | V11 | V11 | V0 | | V9 |
| 10 | 0 | 0 | 0 | 0 | 1 | 0 | 1 | 0 | V7 | V11 | V11 | V11 | V0 | | V10 |
| 11 | 0 | 0 | 0 | 0 | 1 | 0 | 1 | 1 | V11 | V11 | V11 | V11 | V0 | | V11 |
| 12 | 0 | 0 | 0 | 0 | 1 | 1 | 0 | 0 | V11 | V15 | V11 | V11 | V0 | | V12 |
| 13 | 0 | 0 | 0 | 0 | 1 | 1 | 0 | 1 | V11 | V11 | V15 | V15 | V0 | | V13 |
| 14 | 0 | 0 | 0 | 0 | 1 | 1 | 1 | 0 | V11 | V15 | V15 | V15 | V0 | | V14 |
| 15 | 0 | 0 | 0 | 0 | 1 | 1 | 1 | 1 | V15 | V15 | V15 | V15 | V0 | | V15 |
| ⋮ | | | | | | | | | | | | | | | |
| 240 | 1 | 1 | 1 | 1 | 0 | 0 | 0 | 0 | V239 | V243 | V239 | V239 | V0 | Inactive | V240 |
| 241 | 1 | 1 | 1 | 1 | 0 | 0 | 0 | 1 | V239 | V239 | V243 | V243 | V0 | | V241 |
| 242 | 1 | 1 | 1 | 1 | 0 | 0 | 1 | 0 | V239 | V243 | V243 | V243 | V0 | | V242 |
| 243 | 1 | 1 | 1 | 1 | 0 | 0 | 1 | 1 | V243 | V243 | V243 | V243 | V0 | | V243 |
| 244 | 1 | 1 | 1 | 1 | 0 | 1 | 0 | 0 | V243 | V247 | V243 | V243 | V0 | | V244 |
| 245 | 1 | 1 | 1 | 1 | 0 | 1 | 0 | 1 | V243 | V243 | V247 | V247 | V0 | | V245 |
| 246 | 1 | 1 | 1 | 1 | 0 | 1 | 1 | 0 | V243 | V247 | V247 | V247 | V0 | | V246 |
| 247 | 1 | 1 | 1 | 1 | 0 | 1 | 1 | 1 | V247 | V247 | V247 | V247 | V0 | | V247 |
| 248 | 1 | 1 | 1 | 1 | 1 | 0 | 0 | 0 | V248 | V248 | V248 | V248 | V248 | Active | V248 |
| 249 | 1 | 1 | 1 | 1 | 1 | 0 | 0 | 1 | V249 | V249 | V249 | V249 | V249 | | V249 |
| 250 | 1 | 1 | 1 | 1 | 1 | 0 | 1 | 0 | V250 | V250 | V250 | V250 | V250 | | V250 |
| 251 | 1 | 1 | 1 | 1 | 1 | 0 | 1 | 1 | V251 | V251 | V251 | V251 | V251 | | V251 |
| 252 | 1 | 1 | 1 | 1 | 1 | 1 | 0 | 0 | V252 | V252 | V252 | V252 | V252 | | V252 |
| 253 | 1 | 1 | 1 | 1 | 1 | 1 | 0 | 1 | V253 | V253 | V253 | V253 | V253 | | V253 |
| 254 | 1 | 1 | 1 | 1 | 1 | 1 | 1 | 0 | V254 | V254 | V254 | V254 | V254 | | V254 |
| 255 | 1 | 1 | 1 | 1 | 1 | 1 | 1 | 1 | V255 | V255 | V255 | V255 | V255 | | V255 |

FIG. 7

DIGITAL-TO-ANALOG CONVERTER, DATA DRIVER, AND DISPLAY DEVICE

CROSS-REFERENCE TO RELATED APPLICATION

This application claims the priority benefits of Japanese application no. 2023-072303, filed on Apr. 26, 2023. The entirety of the above-mentioned patent application is hereby incorporated by reference herein and made a part of this specification.

BACKGROUND

Technical Field

The disclosure relates to a digital-to-analog converter, a data driver including the digital-to-analog converter, and a display device including the data driver.

Description of Related Art

Currently, liquid crystal display devices or organic EL (Electro Luminescent) display devices, etc. are the mainstream active matrix display devices. Such a display device is equipped with a display panel in which multiple data lines and multiple scan lines are wired in an intersecting manner and display cells connected to the multiple data lines via pixel switches are arranged in a matrix, a data driver which supplies an analog voltage signal corresponding to the gradation level to the multiple data lines of the display panel, and a scan driver which supplies a scan signal for controlling on/off of each pixel switch to the multiple scan lines of the display panel. The data driver includes a digital-to-analog conversion circuit that converts a video digital signal into an analog voltage corresponding to the brightness level and supplies an amplified voltage signal to each data line of the display panel.

A schematic configuration of the data driver will be described hereinafter.

The data driver includes, for example, a shift register, a data register latch, a level shifter, and a DA (digital-to-analog) conversion part.

The shift register generates multiple latch timing signals for selecting a latch in synchronization with a clock signal corresponding to a start pulse supplied from a display controller, and supplies the same to the data register latch. The data register latch captures the video digital data supplied from the display controller every predetermined pieces (for example, n pieces) based on each of the latch timing signals supplied from the shift register, and supplies n video digital data signals representing each piece of video digital data to the level shifter. The level shifter performs level shifting processing to increase the signal amplitude for each of the n video digital data signals supplied from the data register latch, and supplies the obtained n level-shifted video digital data signals to the DA conversion part.

The DA conversion part includes a reference voltage generation circuit, a decoder part, and an amplification part.

The reference voltage generation circuit generates multiple reference voltages with voltage values different from each other and supplies the same to the decoder part. For example, the reference voltage generation circuit supplies to the decoder part multiple divided voltages, obtained by dividing the voltage between a power supply voltage and a standard voltage with a ladder resistor, as a reference voltage group. The decoder part has n decoder circuits provided respectively corresponding to the outputs of the data driver. Each of the decoder circuits receives the video digital data signal supplied from the level shifter, selects a reference voltage corresponding to this video digital data signal from the multiple reference voltages, and supplies the selected reference voltage to the amplification part. The amplification part includes n amplifier circuits that individually amplify the reference voltage selected by each decoder of the decoder part and output the same as a gradation voltage signal.

In the above-described DA conversion part, it is possible to increase the number of gradations (number of colors) of the brightness level that can be expressed as the number of voltage levels of the gradation voltage signal output from the amplifier circuit increases. However, when the number of reference voltages generated by the reference voltage generation circuit is increased in accordance with the increase in the number of voltage levels of the gradation voltage signal, the chip size (manufacturing cost) of the data driver increases accordingly.

Therefore, a DA conversion circuit has been proposed (see, for example, Patent Document 1 (Japanese Patent Application Laid-Open No. 2002-43944)), including a differential amplifier that performs so-called interpolation operation, which generates one of the interpolated voltages obtained by dividing input voltages of two systems into multiple voltages by weighting and averaging (also called weighted average) the input voltages of two systems.

FIG. 1 is a circuit diagram showing the configuration of the differential amplifier described in Patent Document 1.

As shown in FIG. 1, the differential amplifier includes: differential stages of four systems each having a differential pair composed of one pair of N-channel type transistors with sources connected to each other, and a current source (N-channel type transistor) supplying a tail current to this differential pair; a current mirror circuit as a load; and a P-channel type output transistor. Here, input terminals $IN_1$ to $IN_3$ are respectively connected to the gate of one transistor in each differential pair, and the gate of the other transistor in each differential pair is connected to the output terminal OUT. In addition, as shown in FIG. 1, the input terminal $IN_1$ is connected to the gate of one transistor in each of two differential pairs.

Furthermore, the drain of one transistor in each differential pair is connected to the output current path of the current mirror circuit, and the drain of the other transistor in each differential pair is connected to the input current path of the current mirror circuit. The output transistor receives the voltage of the output current path of the current mirror circuit at its own gate, and sends an output current corresponding to the voltage to the output terminal, thereby outputting the output voltage Vd from the output terminal.

Here, when input voltages $VIN_1$ to $VIN_3$ are respectively input to the input terminals $IN_1$ to $IN_3$, the differential amplifier shown in FIG. 1 outputs the output voltage Vd shown below.

$$Vd=(VIN_1\times 2+VIN_2+VIN_3)/4$$

Thus, an output voltage Vd having voltage values of four systems can be generated by, for example, assigning two reference voltages having different voltage values respectively to the input voltages $VIN_1$ to $VIN_3$ in combinations corresponding to the input digital data, including overlap. In other words, according to the differential amplifier having the configuration shown in FIG. 1, four voltage levels can be obtained using two reference voltages, so it is possible to reduce the scale of the device.

In addition, since the differential amplifier described in Patent Document 1 is a so-called single power supply type operational amplifier in which each differential pair is configured by N-channel type transistors, the differential amplifier does not operate below the transistor threshold voltage Vth. Therefore, it is considered to add a new differential amplifier configured by replacing the transistors of each differential stage shown in FIG. 1 with P-channel type transistors, so as to use a so-called rail-to-rail type differential amplifier that can operate over the entire range of the power supply voltage in the above-mentioned DA conversion part.

However, the rail-to-rail differential amplifier configured in this manner has a circuit scale approximately twice as large as that of a single power supply type differential amplifier, and there is a problem that the circuit area of the DA conversion part increases.

The disclosure provides a digital-to-analog converter, a data driver, and a display device that can operate over the entire range of the power supply voltage while suppressing an increase in circuit area.

SUMMARY

A digital-to-analog converter according to the disclosure is configured to convert digital data into an analog output voltage signal. The digital-to-analog converter includes: a decoder selecting two voltages including overlap from a plurality of reference voltages as a first voltage and a second voltage, based on the digital data; and a differential amplifier circuit outputting a signal, which has one voltage value corresponding to the digital data among voltage values obtained by dividing a voltage between the first voltage and the second voltage into N (N is a natural number expressed as a power of 2), as the output voltage signal, in which the differential amplifier circuit includes: first to $N^{th}$ differential stages of a first conductivity type each receiving the first voltage or the second voltage at a non-inverting input terminal thereof to cause a differential current corresponding to the first voltage or the second voltage to flow to a first node, and receiving the output voltage signal at an inverting input terminal thereof to cause a differential current corresponding to the output voltage signal to flow to a second node; a single differential stage of a second conductivity type receiving one voltage of the first voltage and the second voltage at a non-inverting input terminal thereof and receiving the output voltage signal at an inverting input terminal thereof, and being activated in a case where a digital value indicated by the digital data is included in a predetermined range to cause a differential current corresponding to the one voltage received at the non-inverting input terminal thereof to flow to a third node and cause a differential current corresponding to the output voltage signal received at the inverting input terminal thereof to flow to a fourth node; and an output amplification stage outputting, as the output voltage signal, a voltage generated at an output terminal by causing an output current corresponding to a difference between the differential currents respectively flowing to the first node and the second node, or a difference between the differential currents respectively flowing to the third node and the fourth node to the output terminal.

A data driver according to the disclosure includes a plurality of the above digital-to-analog converters. The data driver is configured to convert each video digital data piece representing a brightness level of each pixel as a digital value into a plurality of the output voltage signals each having an analog voltage value by the plurality of digital-to-analog converters, and respectively supply a plurality of drive signals respectively having the plurality of output voltage signals to a plurality of data lines of a display panel.

A display device according to the disclosure includes: a display panel including a plurality of data lines to which a plurality of display cells are respectively connected; and a data driver including a plurality of the above digital-to-analog converters and configured to convert each video digital data piece representing a brightness level of each pixel as a digital value into a plurality of the output voltage signals each having an analog voltage value by the plurality of digital-to-analog converters, and respectively supply a plurality of drive signals respectively having the plurality of output voltage signals to the plurality of data lines of the display panel.

BRIEF DESCRIPTION OF THE DRAWINGS

FIG. 3 is a diagram showing an example of the specifications of the DA converter 100_1.

FIG. 7 is a diagram showing an example of the specifications of the DA converter 100_3.

DESCRIPTION OF THE EMBODIMENTS

In the disclosure, through the differential amplifier circuit including the first to $N^{th}$ differential stages of the first conductivity type, an output voltage signal having one voltage value corresponding to the digital data among the voltage values obtained by dividing the voltage between two voltages into N is generated. However, in the case where the digital value indicated by the digital data is included in a predetermined range, the single differential stage of the second conductivity type is activated, through which an output voltage signal having one voltage value corresponding to the digital data among the voltage values corresponding to the digital values within the predetermined range is generated.

As a result, the differential amplifier circuit can be made rail-to-rail by simply adding one differential stage of the second conductivity type to the first to $N^{th}$ differential stages of the first conductivity type.

Therefore, according to the disclosure, it is possible to suppress an increase in circuit area, compared to a case where the differential amplifier circuit is made rail-to-rail by providing the same number (N) of differential stages of the second conductivity type as the differential stages of the first conductivity type.

First Embodiment

Figure 1:
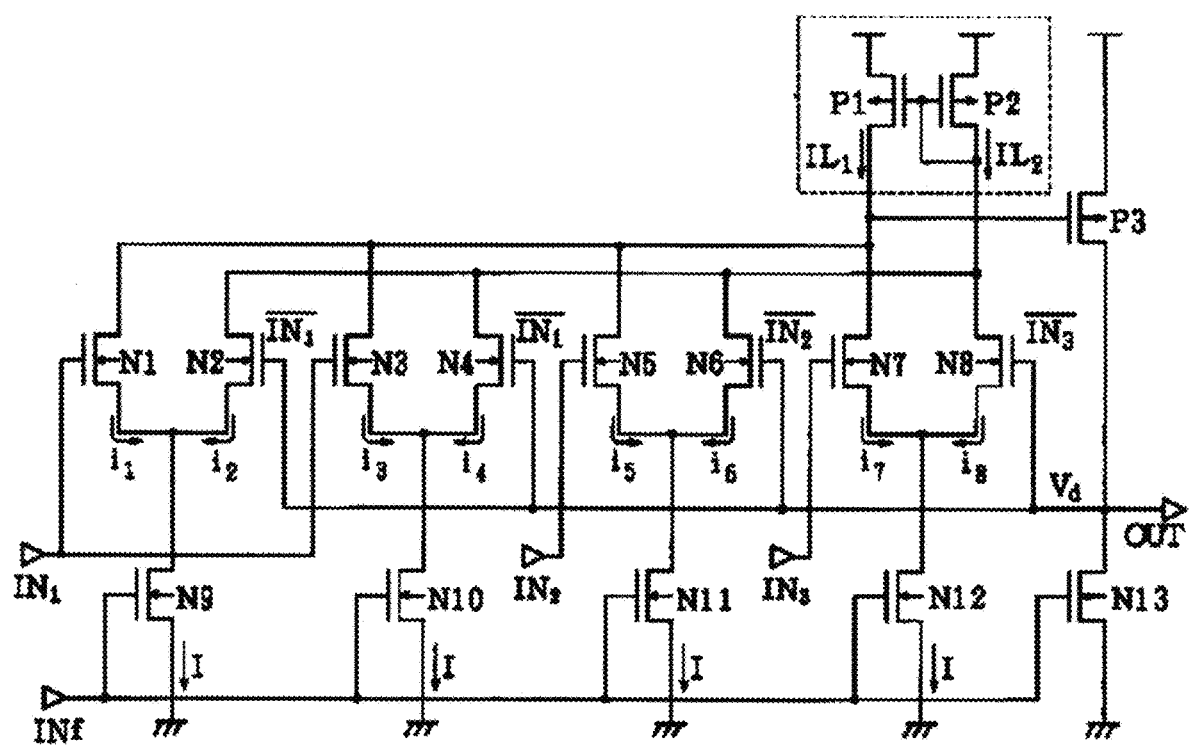
FIG. 1 is a circuit diagram showing the configuration of the conventional differential amplifier included in a digital-to-analog conversion circuit.
Figure 2:
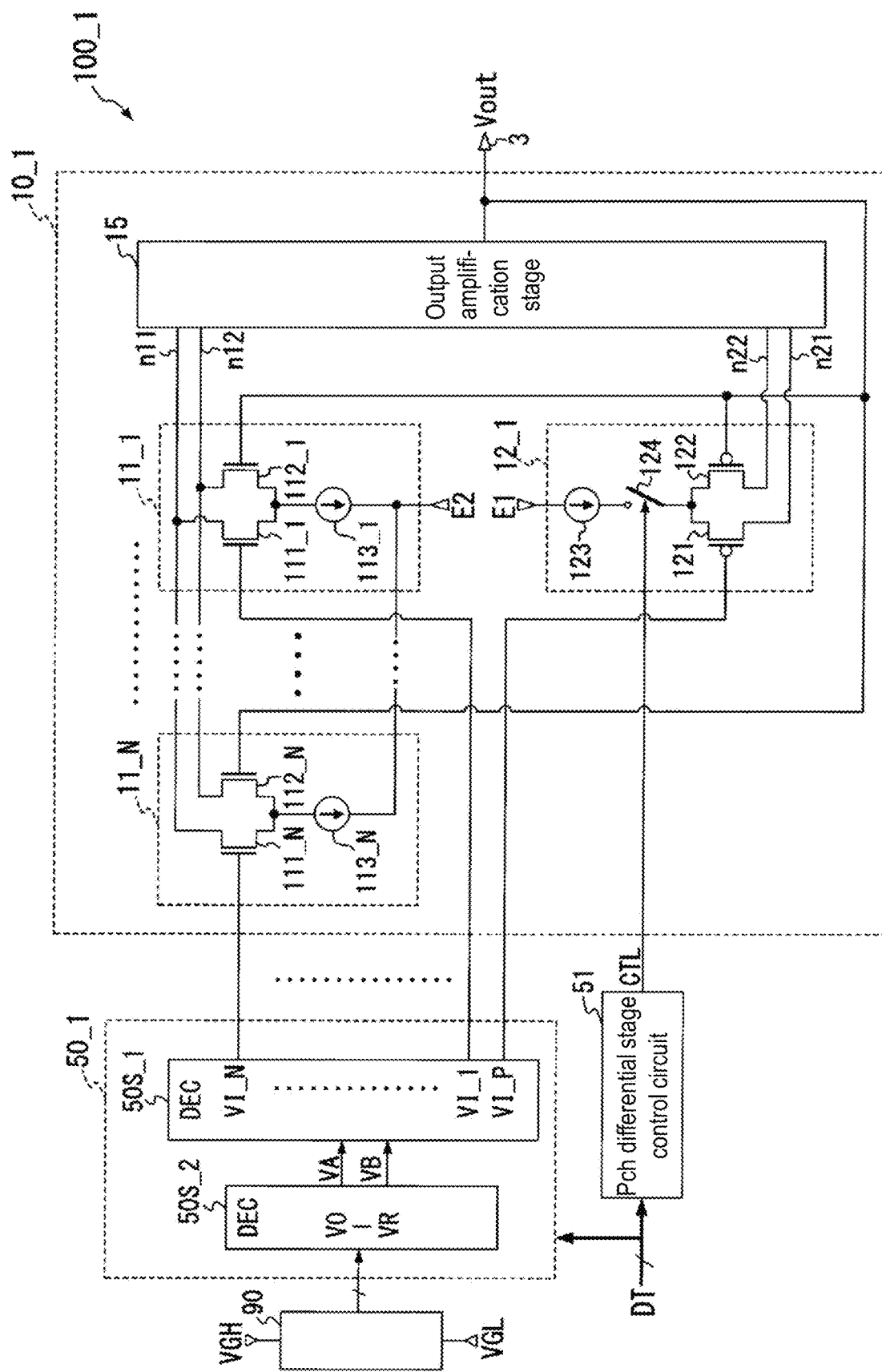
FIG. 2 is a circuit diagram showing the configuration of the DA converter 100_1 as the first embodiment of the disclosure.

FIG. 2 is a circuit diagram showing the configuration of a digital-to-analog converter (hereinafter referred to as DA converter) 100_1 as the first embodiment of the disclosure.

The DA converter 100_1 converts, for example, an 8-bit digital data signal DT (D7 to D0) into an analog voltage value corresponding to the gradation level of a digital value represented by the digital data signal DT, and outputs an output voltage signal Vout having the voltage value from an output terminal 3. As shown in FIG. 2, the DA converter 100_1 includes a reference voltage generation circuit 90, a decoder 50_1, a differential amplifier circuit 10_1, and a P-channel differential stage control circuit 51.

The reference voltage generation circuit 90 receives a DC reference power supply voltage VGH and a reference power supply voltage VGL lower than this reference power supply (R is an integer of 2 or more) having different voltage values based on the reference power supply voltages VGH and VGL, and supplies the reference voltages V0 to VR to the decoder 50_1.

The decoder 50_1 includes sub-decoders 50S_1 and 50S_2.

The sub-decoder 50S_2 selects a pair of voltages including overlap as two voltages (VA, VB) from the reference voltages V0 to VR based on the upper bit group of the digital data signal DT. The sub-decoder 50S_2 supplies the two selected voltages (VA, VB) to the sub-decoder 50S_1.

The sub-decoder 50S_1 selects a combination of assigning the voltage VA or VB as the voltage value of each of the input voltages VI_N to VI_1 of N (N is a natural number expressed as a power of 2) systems based on the lower bit group of the digital data signal DT. Then, the sub-decoder 50S_1 supplies the input voltages VI_N to VI_1, each having the voltage VA or VB assigned in this manner, to the differential amplifier circuit 10_1.

Further, the sub-decoder 50S_1 supplies any one of the input voltages VI_N to VI_1 supplied to the differential amplifier circuit 10_1 as the input voltage VI_P to the differential amplifier circuit 10_1.

The P-channel differential stage control circuit 51 supplies to the differential amplifier circuit 10_1 a control signal CTL that prompts activation of the P-channel differential stage in the case where the gradation level represented by the digital data signal DT is included in a predetermined range, and prompts deactivation of the P-channel differential stage in the case where this gradation level is not included in the predetermined range. In addition, the predetermined range includes a range of the gradation level of the digital data signal DT where the voltage value of at least one of the two voltages (VA, VB) selected by the sub-decoder 50S_2 based on the digital data signal DT is lower than the threshold voltage of an N-channel type transistor.

The differential amplifier circuit 10_1 includes N (N is a natural number expressed as a power of 2) differential stages 11_1 to 11_N of a first conductivity type (N-channel type) connected in parallel, a single differential stage 12_1 of a second conductivity type (P-channel type), and an output amplification stage 15.

Each of the N-channel type differential stages 11_1 to 11_N has the same configuration, that is, a differential pair composed of a pair of N-channel type transistors and a current source which receives a power supply voltage E2 and causes a tail current to flow to the differential pair.

For example, the differential stage 11_1 includes a differential pair composed of N-channel type transistors 111_1 and 112_1, and a current source 113_1. The current source 113_1 receives the power supply voltage E2 and generates a predetermined constant current.

The transistor 111_1 receives the input voltage VI_1 at its own gate (non-inverting input terminal), and the transistor 112_1 receives the output voltage signal Vout at its own gate (inverting input terminal). The sources of the transistors 111_1 and 112_1 are connected to the current source 113_1, the drain of the transistor 111_1 is connected to a node n11, and the drain of the transistor 112_1 is connected to a node n12. Thereby, the transistor 111_1 causes a differential current corresponding to the input voltage VI_1 in the constant current of the current source 113_1 to flow to the node n11, and the transistor 112_1 causes a differential current corresponding to the output voltage signal Vout in the constant current of the current source 113_1 to flow to the node n12.

Further, for example, the differential stage 11_2 includes a differential pair composed of N-channel type transistors 111_2 and 112_2, and a current source 113_2. The current source 113_2 receives the power supply voltage E2 and generates a predetermined constant current. The transistor 111_2 receives the input voltage VI_2 at its own gate (non-inverting input terminal), and the transistor 112_2 receives the output voltage signal Vout at its own gate (inverting input terminal). The sources of the transistors 111_2 and 112_2 are connected to the current source 113_2, the drain of the transistor 111_2 is connected to the node n11, and the drain of the transistor 112_2 is connected to the node n12. Thereby, the transistor 111_2 causes a differential current corresponding to the input voltage VI_2 in the constant current of the current source 113_2 to flow to the node n11, and the transistor 112_2 causes a differential current corresponding to the output voltage signal Vout in the constant current of the current source 113_2 to flow to the node n12.

Further, for example, the differential stage 11_N includes a differential pair composed of N-channel type transistors 111_N and 112_N, and a current source 113_N. The current source 113_N receives the power supply voltage E2 and generates a predetermined constant current. The transistor 111_N receives the input voltage VI_N at its own gate (non-inverting input terminal), and the transistor 112_N receives the output voltage signal Vout at its own gate (inverting input terminal). The sources of the transistors 111_N and 112_N are connected to the current source 113_N, the drain of the transistor 111_N is connected to the node n11, and the drain of the transistor 112_N is connected to the node n12. Thereby, the transistor 111_N causes a differential current corresponding to the input voltage VI_N in the constant current of the current source 113_N to flow to the node n11, and the transistor 112_N causes a differential current corresponding to the output voltage signal Vout in the constant current of the current source 113_N to flow to the node n12.

Therefore, through the N-channel type differential stages 11_1 to 11_N, a current obtained by combining N differential currents respectively corresponding to the input voltages VI_1 to VI_N flows to the node n11, and a current obtained by combining N differential currents respectively corresponding to the output voltage signal Vout flows to the node n12.

The P-channel type differential stage 12_1 includes a differential pair composed of P-channel type transistors 121 and 122, a current source 123, and a switch element 124. The current source 123 receives a power supply voltage E1 (E1>E2) and generates a predetermined constant current.

The switch element 124 receives the control signal CTL, is turned on in the case where the control signal CTL instructs to activate the P-channel differential stage, and sends the constant current generated by the current source 123 to the sources of the transistors 121 and 122 as a tail current. Thereby, the differential stage 12_1 enters an active state. On the other hand, in the case where the control signal CTL instructs to deactivate the P-channel differential stage, the switch element 124 is turned off and cuts off the connection between the current source 123 and the differential pair (121, 122). Thereby, the differential stage 12_1 enters a so-called inactive state in which its own operation is stopped.

The transistor 121 receives the input voltage VI_P at its own gate (non-inverting input terminal), and the transistor 122 receives the output voltage signal Vout at its own gate (non-inverting input terminal). The sources of the transistors 121 and 122 are connected to the switch element 124, the drain of the transistor 121 is connected to the node n21, and the drain of the transistor 122 is connected to the node n22. Thereby, while the differential stage 12_1 is in the active state, the transistor 121 sends a differential current corresponding to the input voltage VI_P in the constant current of the current source 123 to the output amplification stage 15 via the node n21, and the transistor 122 sends a differential current corresponding to the output voltage signal Vout in the constant current of the current source 123 to the output amplification stage 15 via the node n22.

Therefore, through the differential stage 12_1, a differential current corresponding to the input voltage VI_P flows to the node n21, and a differential current corresponding to the output voltage signal Vout flows to the node n22.

The output amplification stage 15 causes an output current, which is based on the difference between the differential currents (referred to as Nch side differential currents) that the differential stages 11_1 to 11_N respectively flow to the nodes n11 and n12 according to the input voltages VI_1 to VI_N or the difference between the differential currents (referred to as Pch side differential currents) that the differential stage 12_1 respectively flows to the nodes n21 and n22 according to the input voltage VI_P, to flow to the output terminal 3, thereby outputting the voltage generated at the output terminal 3 as the output voltage signal Vout. In addition, when the voltage VA or VB is supplied in a predetermined combination as the input voltages VI_1 to VI_N to the differential stages 11_1 to 11_N, the output voltage signal Vout becomes a voltage having one voltage level of the voltage levels obtained by dividing the voltage between the above-mentioned voltages VA and VB into a power of 2. Further, when the differential stage 12_1 is activated and the input voltage VI_P is supplied to the differential stage 12_1, the output voltage signal Vout becomes the same voltage as the input voltage VI_P.

Accordingly, the differential amplifier circuit 10_1 shown in FIG. 2 generates the output voltage signal Vout shown by $$Vout = (VI\_1 + VI\_2 + VI\_3 + \ldots + VI\_N)/N$$

according to the input voltages VI_1 to VI_N based on the digital data signal DT supplied from the decoder 50_1.

Furthermore, the differential amplifier circuit 10_1 generates the output voltage signal Vout shown by $$Vout = VI\_P$$

in the case where the gradation level represented by the digital data signal DT is included in the predetermined range.

Thus, in the differential amplifier circuit 10_1, the output voltage signal Vout, which has one voltage value corresponding to the digital data signal DT among N voltage values obtained by dividing the voltage between the two voltages VA and VB selected from the reference voltages V0 to VR based on the digital data signal DT by the decoder 50_1, is generated by the N-channel type differential stages 11_1 to 11_N. However, in the case where the gradation level represented by the digital data signal DT is included in the predetermined range, the single P-channel type differential stage 12_1 is activated, and the output voltage signal Vout, which has one voltage value corresponding to the digital data signal DT among the voltage values corresponding to the gradation levels within this predetermined range, is generated by the P-channel type differential stage 12_1.

Then, the differential amplifier circuit 10_1 outputs the generated output voltage signal Vout from the output terminal 3, and feeds back the output voltage signal Vout to the differential stages 11_1 to 11_N and 12_1 included therein.

FIG. 3 is a diagram showing an example of the specifications when the DA converter 100_1 shown in FIG. 2 is actually operated. That is, FIG. 3 shows the specifications in the case where the number N of the N-channel type differential stages in the DA converter 100_1 is 4, and the digital data signal DT representing the brightness level of a video signal in 8 bits (D7 to D0) is subjected to DA conversion. In addition, the DA converter 100_1 converts the digital data signal DT into 256 levels of analog voltages V0 to V255 in accordance with the positive gamma characteristic γP or the negative gamma characteristic γN shown in FIG. 4, but FIG. 3 shows only a specification example corresponding to the negative gamma characteristic γN shown in FIG. 4.

In the specifications shown in FIG. 3, it is assumed that the gradation level 0 side is converted into a high potential (near the power supply voltage E1) voltage, and the gradation level 255 side is converted into a low potential (near the power supply voltage E2) voltage. Furthermore, in the specifications shown in FIG. 3, the range of gradation levels 0 to 7 and the range of gradation levels 248 to 255, where the change in gradation level of the gamma characteristic and the voltage difference between levels are large, are set as a linear interpolation exclusion section OL, and the range of gradation levels 8 to 247, where the change in gradation level of the gamma characteristic is gradual and the voltage difference between levels is small, is set as a linear interpolation section IL.

In addition, according to the specifications shown in FIG. 3, the reference voltage generation circuit 90 generates reference voltages V0 to V7 having voltage values respectively corresponding to gradation levels 0 to 7, reference voltages V7, V11, V15, . . . , V247 having voltage values respectively corresponding to every fourth gradation level among gradation levels 7 to 247, and reference voltages V248 to V255 having voltage values respectively corresponding to gradation levels 248 to 255, and supplies the same to the decoder 50_1.

In the case where the gradation level indicated by the digital data signal DT is included in the linear interpolation exclusion section OL shown in FIG. 3, the decoder 50_1 selects the reference voltage corresponding to the gradation level from the reference voltages V0 to V255. For example, as shown in FIG. 3, in the case where the digital data signal DT represents bits D7 to D0 [00000110] indicating gradation level 6, the decoder 50_1 selects the reference voltage V6 from the reference voltages V0 to V255. Then, the decoder 50_1 supplies the input voltages VI_1 to VI_4, each having the selected one reference voltage, respectively to the N-channel type differential stages 11_1 to 11_4.

On the other hand, in the case where the gradation level indicated by the digital data signal DT is included in the linear interpolation section IL, the decoder 50_1 selects two voltages VA and VB having different voltage values from the reference voltages V7, V11, V15, . . . , V247 at every fourth gradation based on bits D7 to D2. Then, the decoder 50_1 supplies voltages, obtained by assigning the two voltages VA and VB as the voltage value of each of the input voltages VI_1 to VI_4 based on bits D1 and D0, respectively to the differential stages 11_1 to 11_4. For example, as shown in FIG. 3, in the case where the digital data signal DT represents bits D7 to D0 [00001101] indicating gradation level 13, the decoder 50_1 selects the reference voltages V11 and V15 from the reference voltages V0 to V255. Then, the decoder 50_1 supplies the input voltage VI_1 having the selected reference voltage V11 to the differential stage 11_1, and supplies the input voltage VI_2 having the reference voltage V11 to the differential stage 11_2. Further, the decoder 50_1 supplies the input voltage VI_3 having the selected reference voltage V15 to the differential stage 11_3, and supplies the input voltage VI_4 having the reference voltage V15 to the differential stage 11_4.

Furthermore, the decoder 50_1 supplies the input voltage VI_P having the same voltage value as any one of the above input voltages VI_1 to VI_4 to the P-channel type differential stage 12_1 based on the gradation level indicated by the digital data signal DT. In addition, in the specifications shown in FIG. 3, the input voltage VI_P having the same voltage value as the input voltage VI_1 is supplied to the differential stage 12_1.

Further, in the specifications shown in FIG. 3, in the case where the gradation level represented by the digital data signal DT is included in the range of gradation levels 248 to 255, the P-channel differential stage control circuit 51 supplies the control signal CTL that prompts activation of the P-channel differential stage to the differential stage 12_1. On the other hand, in the case where the gradation level represented by the digital data signal DT is not included in the range of gradation levels 248 to 255, the P-channel differential stage control circuit 51 supplies the control signal CTL that prompts deactivation of the P-channel differential stage to the differential stage 12_1.

In addition, the range of gradation levels 248 to 255 refers to a range including gradation levels where the voltage value of the input voltage (VI_1 to VI_4, VI_P) corresponding to the gradation level included in the range falls below the threshold voltage of the N-channel type transistor (111_1 to 111_4) and the differential stages 11_1 to 11_4 become inoperable.

As described above, in the specifications shown in FIG. 3, in the case where the digital data signal DT represents a gradation level outside the range of gradation levels 248 to 255, that is, in the case where the N-channel type differential stages 11_1 to 11_4 are operable, the output voltage signal Vout shown by equation (1) is generated by the differential stages 11_1 to 11_4.

$$Vout = (VI\_1 + VI\_2 + VI\_3 + VI\_N4)/4 \qquad (1)$$

In addition, in the case of a configuration composed of N N-channel type differential stages 11_1 to 11_N, the output voltage signal Vout shown by equation (2) is generated.

$$Vout = (VI\_1 + VI\_2 + VI\_3 + \ldots + VI\_N)/N \qquad (2)$$

Furthermore, in the case where the digital data signal DT represents a gradation level in the range of gradation levels 248 to 255, that is, even in the case where the N-channel type differential stages 11_1 to 11_4 are inoperable, the output voltage signal Vout shown by equation (3) is generated by the activated P-channel type differential stage 12_1.

$$Vout = VI\_P \qquad (3)$$

Thus, in the DA converter 100_1 that operates according to the specifications of FIG. 3, when the gradation level represented by the digital data signal DT is in the voltage range (gradation levels 0 to 247) where the N-channel type differential stages 11_1 to 11_4 are operable, the output voltage signal Vout, which has a voltage value obtained by linearly interpolating or averaging the input voltages VI_1 to VI_4 corresponding to the gradation level, is generated by the differential stages 11_1 to 11_4.

On the other hand, when the gradation level represented by the digital data signal DT is in the predetermined range (gradation levels 248 to 255) including a voltage at which the N-channel type differential stages 11_1 to 11_4 are inoperable, the differential stage 12_1 is activated, and the output voltage signal Vout having a voltage value corresponding to the input voltage VI_P that corresponds to the gradation level is generated by the differential stage 12_1.

That is to say, the DA converter 100_1 generates the output voltage signal Vout using the N-channel type differential stages 11_1 to 11_4 in the case where the voltage values of the input voltages VI_1 to VI_4 corresponding to the gradation level represented by the digital data signal DT are equal to or higher than the threshold voltage of the N-channel type transistor. On the other hand, in the case where the voltage values of the input voltages VI_1 to VI_4 corresponding to the gradation level are lower than the threshold voltage of the N-channel type transistor, the output voltage signal Vout is generated using the P-channel type differential stage 12_1.

At this time, the voltage below the threshold voltage of the N-channel type transistor is set within a predetermined range (gradation levels 248 to 255). At the gradation levels 248 to 255, the same voltage value is input to the input voltages VI_1 to VI_4 of the N-channel type differential stages 11_1 to 11_4 and the input voltage VI_P of the P-channel type differential stage 12_1. At the gradation levels 248 to 255, for input voltages equal to or higher than the threshold voltage of the N-channel type transistor, the N-channel type differential stages 11_1 to 11_4 and the P-channel type differential stage 12_1 operate together to output the output voltage signal Vout having a voltage value corresponding to the input voltage VI_P. On the other hand, for input voltages lower than the threshold voltage of the N-channel type transistor, the N-channel type differential stages 11_1 to 11_4 become inactive, and only the P-channel type differential stage 12_1 operates to output the output voltage signal Vout having a voltage value corresponding to the input voltage VI_P. In addition, the N-channel type differential stages 11_1 to 11_4 may be controlled to be inactive in a predetermined range (gradation levels 248 to 255). Therefore, as shown in FIG. 2, by simply providing one system of P-channel type differential stage 12_1 together with N systems of N-channel type differential stages 11_1 to 11_N, it is possible to realize the DA converter 100_1 including the so-called rail-to-rail type differential amplifier circuit 10_1 that can operate over the entire range of the power supply voltage (E1 to E2).

Therefore, according to the DA converter 100_1, it is possible to suppress an increase in circuit area, compared to a case where the differential amplifier circuit is made rail-to-rail by adding N systems of P-channel type differential stages having the same scale as the N-channel type differential stages 11_1 to 11_N.

Second Embodiment

Figure 5:
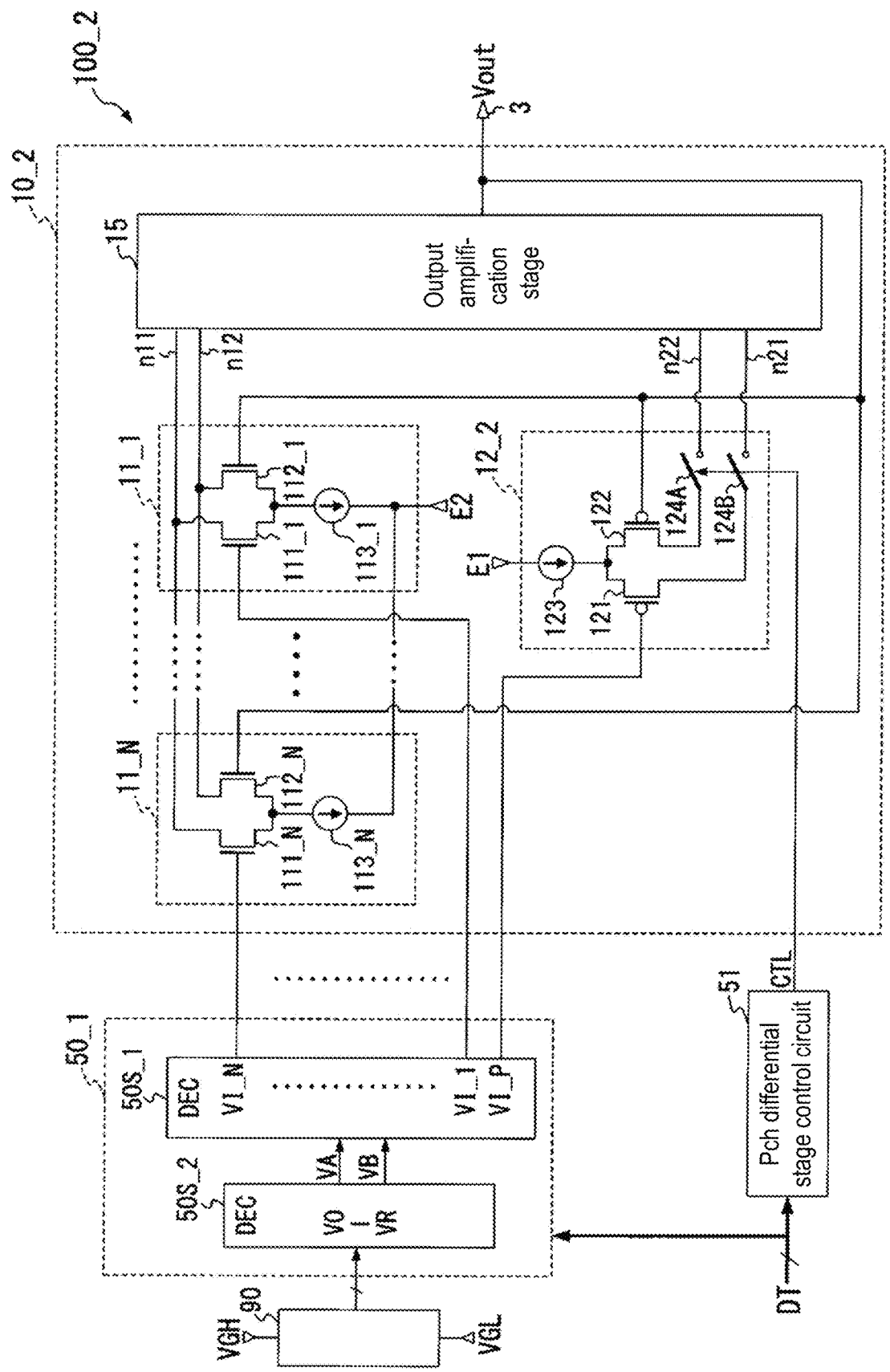
FIG. 5 is a circuit diagram showing the configuration of the DA converter 100_2 as the second embodiment of the disclosure.

FIG. 5 is a circuit diagram showing the configuration of a DA converter 100_2 as the second embodiment of the disclosure.

It should be noted that, in the DA converter 100_2 shown in FIG. 5, a differential amplifier circuit 10_2 is used instead of the differential amplifier circuit 10_1 shown in FIG. 2, and the other components (90, 50_1, 51) are the same as those shown in FIG. 2. Further, in the differential amplifier circuit 10_2, a P-channel type differential stage 12_2 is used instead of the P-channel type differential stage 12_1 shown in FIG. 2, and the N-channel type differential stages 11_1 to 11_N are the same as those shown in FIG. 2.

Therefore, only the configuration and operation of the differential stage 12_2 will be described below.

Similar to the differential stage 12_1, the differential stage 12_2 includes a differential pair composed of P-channel type transistors 121 and 122, and a current source 123.

However, in the differential stage 12_2, switch elements 124A and 124B are used instead of the switch element 124 shown in FIG. 2.

The current source 123 included in the differential stage 12_2 receives the power supply voltage E1 (E1>E2), generates a predetermined constant current, and sends this to the sources of the transistors 121 and 122.

The transistor 121 included in the differential stage 12_2 receives the input voltage VI_P supplied from the decoder 50_1 at its own gate (non-inverting input terminal), and sends a differential current corresponding to the input voltage VI_P from its own drain to the switch element 124B. The transistor 122 included in the differential stage 12_2 receives the output voltage signal Vout at its own gate (inverting input terminal), and sends a differential current corresponding to the output voltage signal Vout from its own drain to the switch element 124A.

Each of the switch elements 124A and 124B receives the control signal CTL, and is turned on in the case where the control signal CTL instructs activation of the P-channel differential stage and is turned off in the case where the control signal CTL instructs deactivation. In the case where the switch elements 124A and 124B are turned on, the currents sent from the transistors 121 and 122 are sent to the output amplification stage 15 via the nodes n21 and n22, respectively. Thereby, the differential stage 12_2 enters an active state. On the other hand, in the case where the switch elements 124A and 124B are turned off, the connection between the transistors 121 and 122 and the nodes n21 and n22 is cut off. Thereby, the differential stage 12_2 enters an inactive state.

That is, with such a configuration, similar to the differential stage 12_1, the differential stage 12_2 is activated when the gradation level represented by the digital data signal DT is in a predetermined range (for example, gradation levels 248 to 255 shown in FIG. 3) including a voltage range in which the N-channel type differential stages 11_1 to 11_4 are inoperable. Thereby, when the gradation level represented by the digital data signal DT is within the predetermined range, even if the N-channel type differential stages 11_1 to 11_N are inoperable, the differential stage 12_2 operates to generate the output voltage signal Vout having a voltage value corresponding to the gradation level.

Third Embodiment

Figure 6:
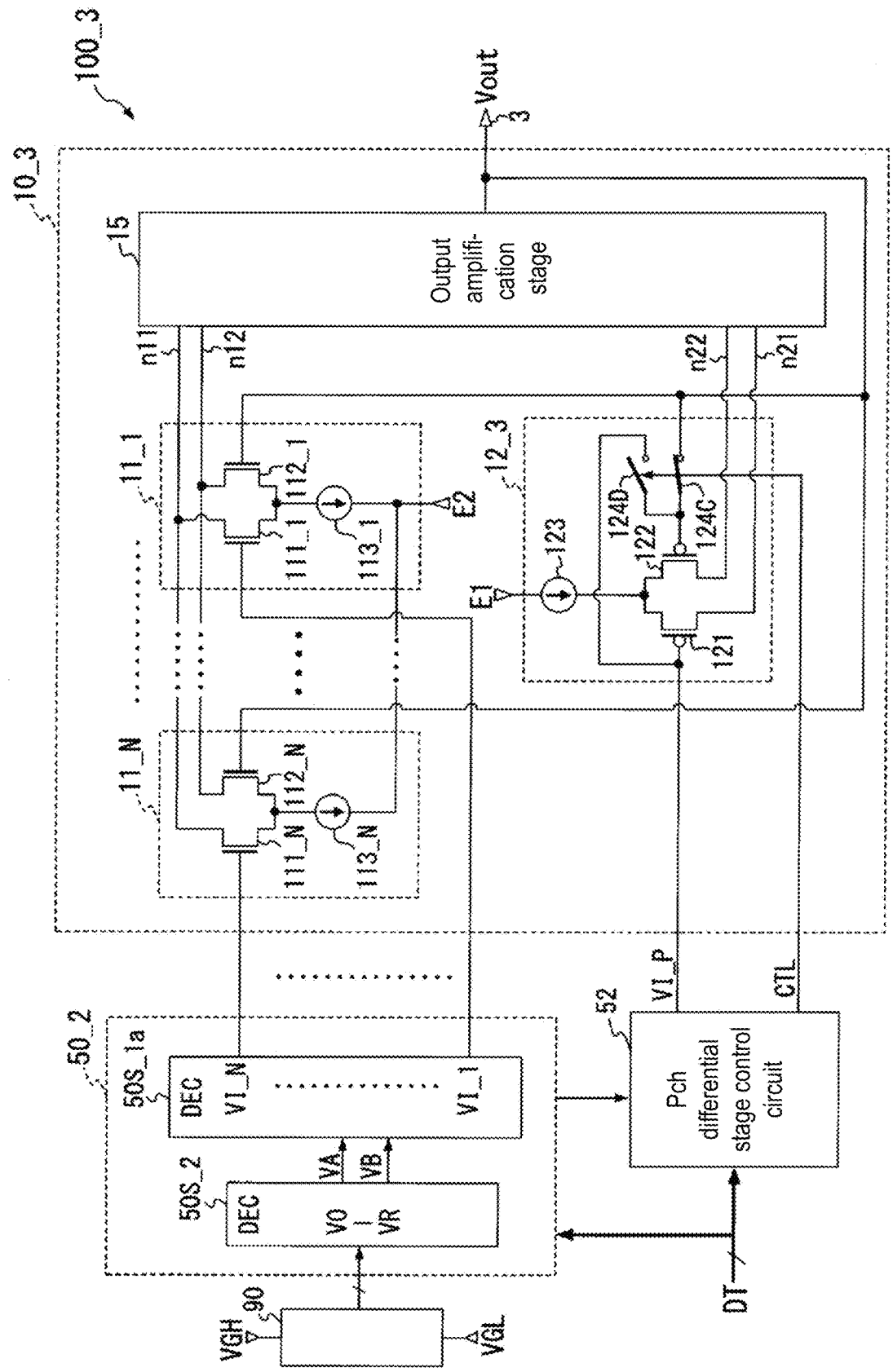
FIG. 6 is a circuit diagram showing the configuration of the DA converter 100_3 as the third embodiment of the disclosure.

FIG. 6 is a circuit diagram showing the configuration of a DA converter 100_3 as the third embodiment of the disclosure.

It should be noted that, in the DA converter 100_3 shown in FIG. 6, a differential amplifier circuit 10_3 is used instead of the differential amplifier circuit 10_1 shown in FIG. 2, a decoder 50_2 is used instead of the decoder 50_1 shown in FIG. 2, and a P-channel differential stage control circuit 52 is used instead of the P-channel differential stage control circuit 51 shown in FIG. 2. The reference voltage generation circuit 90 shown in FIG. 6 is the same as that shown in FIG. 2.

The decoder 50_2 includes a sub-decoder 50S_2, similar to the decoder 50_1 shown in FIG. 2. However, in the decoder 50_2, a sub-decoder 50S_1a is used instead of the sub-decoder 50S_1 included in the decoder 50_1. In addition, the sub-decoder 50S_1a is the same as the sub-decoder 50S_1 except that the function of generating the input voltage VI_P is omitted from the sub-decoder 50S_1.

Similar to the P-channel differential stage control circuit 51, the P-channel differential stage control circuit 52 generates the control signal CTL that prompts activation of the P-channel differential stage in the case where the gradation level represented by the digital data signal DT is included in a predetermined range, and prompts deactivation of the P-channel differential stage in the case where the gradation level is not included in the predetermined range. Then, the P-channel differential stage control circuit 52 supplies this control signal CTL to the P-channel type differential stage 12_3. Further, in the case where the gradation level represented by the digital data signal DT is included in the predetermined range, the P-channel differential stage control circuit 52 supplies one of the two voltages VA and VB selected by the sub-decoder 50S_2 to the differential stage 12_3 as the input voltage VI_P.

Similar to the differential stage 12_2 shown in FIG. 5, the P-channel type differential stage 12_3 includes a differential pair composed of P-channel type transistors 121 and 122, and a current source 123.

However, in the differential stage 12_3, switch elements 124C and 124D are used instead of the switch elements 124A and 124B shown in FIG. 5. Furthermore, in the differential stage 12_3, the drain of the transistor 121 is connected to the node n21, and the drain of the transistor 122 is connected to the node n22.

The switch elements 124C and 124D receive the control signal CTL, and are respectively turned on or off in a complementary manner according to the control signal CTL.

That is, in the case where the control signal CTL instructs to deactivate the P-channel differential stage, the switch element 124C is turned off and the switch element 124D is turned on. Thereby, the gates of the transistors 121 and 122, that is, the non-inverting input terminal and the inverting input terminal of the differential stage 12_3, are short-circuited, so the differential stage 12_3 does not contribute to the amplification effect of the differential amplifier circuit 10_3 and is substantially in an inactive state.

On the other hand, in the case where the control signal CTL instructs to activate the P-channel differential stage, the switch element 124C is turned on and the switch element 124D is turned off. Thereby, the short circuit state between the non-inverting input terminal and the inverting input terminal of the differential stage 12_3 is released, and the differential stage 12_3 becomes active.

In addition, in making the differential stage 12_3 inactive, the P-channel differential stage control circuit 52 may supply, as the input voltage VI_P, a reference voltage having a voltage value that turns off both the transistors 121 and 122 among the reference voltages V0 to VR to the gates of the transistors 121 and 122, that is, the non-inverting input terminal and the inverting input terminal of the differential stage 12_3. Thereby, the differential stage 12_3 is completely stopped, making it possible to further reduce power consumption.

Fourth Embodiment

FIG. 7 is a diagram showing an example of the specifications of the DA converter 100_3 shown in FIG. 6.

Figure 4:
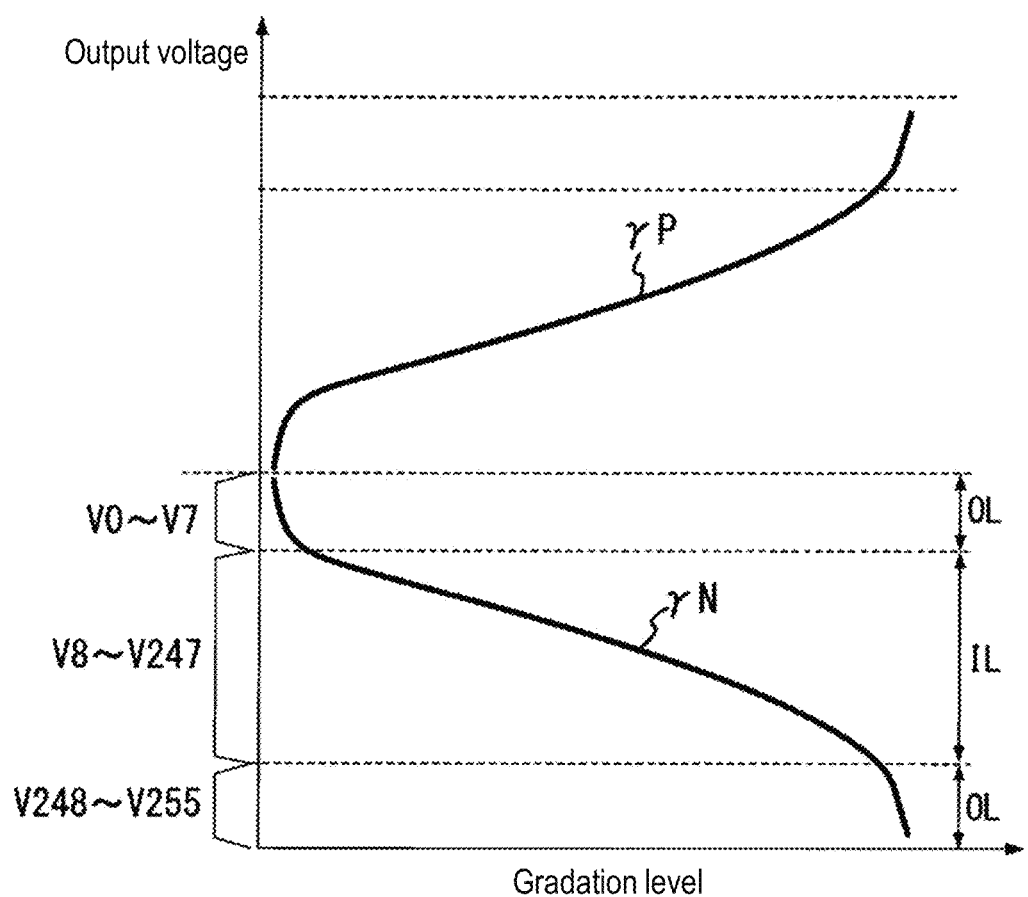
FIG. 4 is a diagram showing an example of the DA conversion characteristics of the DA converter 100_1.

Similar to the specifications shown in FIG. 3, FIG. 7 shows the specifications when converting the digital data signal DT into 256 levels of analog voltages V0 to V255 in accordance with the negative gamma characteristic γN shown in FIG. 4. Furthermore, in the specifications shown in FIG. 7, a linear interpolation section IL and a linear interpolation exclusion section OL are set similar to those in the specifications shown in FIG. 3.

According to the specifications shown in FIG. 7, the P-channel differential stage control circuit 52 supplies the input voltage VI_P having the same voltage value as the input voltages (VI_1 to VI_4) supplied to the differential stages (11_1 to 11_4) to the non-inverting input terminal of the differential stage 12_3 only in the case where the gradation level represented by the digital data signal DT is included in the gradation levels 248 to 255 on the low voltage side (linear interpolation exclusion section OL).

Further, the P-channel differential stage control circuit 52 supplies, for example, the reference voltage V0 having a voltage value near the power supply voltage E1 at which the differential pair (121, 122) is turned off, as the input voltage VI_P, to the non-inverting input terminal and the inverting input terminal of the differential stage 12_3 in the case where the gradation level represented by the digital data signal DT is included in the range of gradation levels 0 to 247.

Fifth Embodiment

Figure 8:
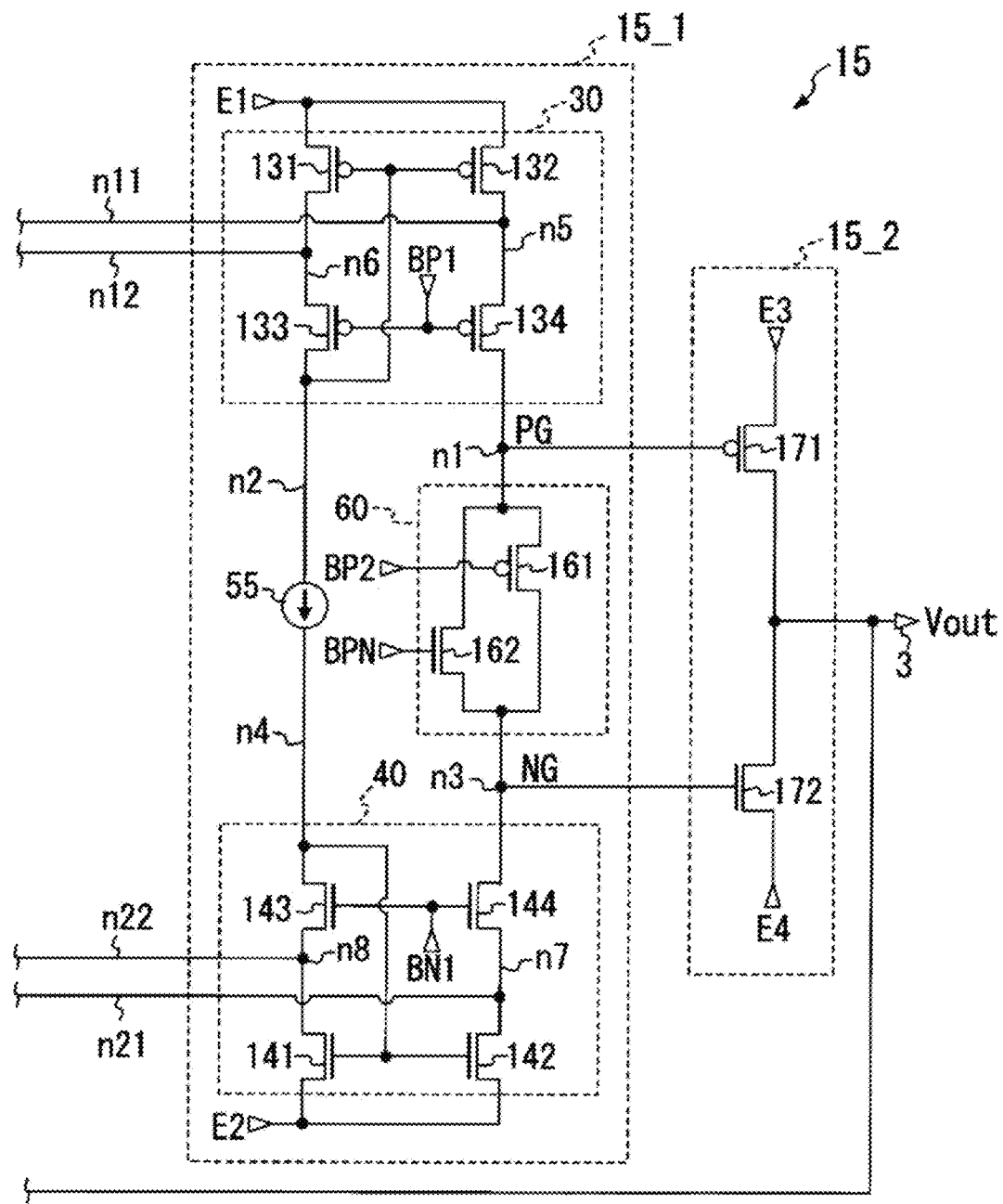
FIG. 8 is a circuit diagram showing an example of the internal configuration of the output amplification stage 15.

FIG. 8 is a circuit diagram showing the configuration of the output amplification stage 15 suitable for FIG. 2, FIG. 5, and FIG. 6.

As shown in FIG. 8, the output amplification stage 15 includes a current-voltage converter 15_1 and an output stage 15_2.

The current-voltage converter 15_1 includes cascode current mirror circuits 30 and 40, a current source 55, and a floating current source 60.

The cascode current mirror circuit 30 includes P-channel type transistors 131 to 134, and the cascode current mirror circuit 40 includes N-channel type transistors 141 to 144. The floating current source 60 includes a P-channel type transistor 161 and an N-channel type transistor 162.

The power supply voltage E1 is applied to the sources of the transistors 131 and 132 of the cascode current mirror circuit 30, and the respective gates are connected to each other. The drain of the transistor 131 is connected to the source of the transistor 133 via the node n6, and is respectively connected via the node n12 to each of the differential stages 11_1 to 11_N shown in FIG. 2, FIG. 5, or FIG. 6. The drain of the transistor 132 is connected to the source of the transistor 134 via the node n5, and is connected to each of the differential stages 11_1 to 11_N shown in FIG. 2, FIG. 5, or FIG. 6 via the node n11. A bias voltage BP1 is applied to both the gates of the transistors 133 and 134. The drain of the transistor 133 is connected to the current source 55 via the node n2, and is connected to the gates of the transistors 131 and 132.

The current source 55 generates a predetermined constant current and sends this from the node n2 to the drain of the transistor 143 of the cascode current mirror circuit 40 via the node n4.

The drain of the transistor 134 is connected to the source of the transistor 161 and the drain of the transistor 162 of the floating current source 60 via the node n1 as a drive node on the high potential side.

A bias voltage BP2 is applied to the gate of the transistor 161, and a bias voltage BPN is applied to the gate of the transistor 162. The drain of the transistor 161 and the source of the transistor 162 are connected to the drain of the transistor 144 of the cascode current mirror circuit 40 via the node n3 as a drive node on the low potential side.

A bias voltage BNI is applied to the gates of the transistors 143 and 144. The source of the transistor 143 is connected to the drain of the transistor 141 via the node n8, and is connected to the differential stage 12_1, 12_2, or 12_3 shown in FIG. 2, FIG. 5, or FIG. 6 via the node n22. The source of the transistor 144 is connected to the drain of the transistor 142 via the node n7, and is connected to the differential stage 12_1, 12_2, or 12_3 shown in FIG. 2, FIG. 5, or FIG. 6 via the node n21. The power supply voltage E2 is applied to the sources of the transistors 141 and 142, and the gates of the transistors 141 and 142 are connected to the drain of the transistor 143.

The output stage 15_2 includes a P-channel type transistor 171 and an N-channel type transistor 172.

The power supply voltage E3 (E3>E1) is applied to the source of the transistor 171, and the gate of the transistor 171 receives the voltage PG of the node n1. The power supply voltage E4 (E2>E4) is applied to the source of the transistor 172, and the gate of the transistor 172 receives the voltage NG of the node n3. The drains of the transistors 171 and 172 are connected to the output terminal 3.

The operation of the current-voltage converter 15_1 including the cascode current mirror circuits 30 and 40, the current source 55, and the floating current source 60 described above, and the output stage 15_2 will be described below.

The input voltages VI_1 to VI_N and the output voltage signal Vout are respectively differentially input to the differential pairs of the N-channel type differential stages 11_1 to 11_N connected to the nodes n11 and n12, and the input voltage VI_P and the output voltage signal Vout are differentially input to the P-channel type differential stage 12_1 (or 12_2, or 12_3) connected to the nodes n21 and n22. Furthermore, in the stable output state, the input voltages VI_1 to VI_N and the output voltage signal Vout satisfy equation (2). Further, when the P-channel type differential stage 12_1 is activated within a predetermined range, the input voltage VI_P and the output voltage signal Vout satisfy equation (3). At this time, the differential currents flowing to the nodes n11 and n12 are equal, and the differential currents flowing to the nodes n21 and n22 are also equal. In addition, the cascode current mirror circuit 30 receives a current from the substantially constant current source 55 at the node n2 and supplies the current returned by the power supply voltage E1 to the node n1, and the cascode current mirror circuit 40 receives a constant current of the current source 55 at the node n4 and extracts the current returned by the power supply voltage E2 from the node n3.

Since the floating current source 60 causes equal currents to flow in and out via the nodes n1 and n3 at both ends, the voltage PG at the node n1 and the voltage NG at the node n3 each maintain a stable state, and the output stage 15_2 holds the output voltage signal Vout at the output terminal 3.

For example, in the case where the voltage VA or VB higher than the voltage in the stable output state is supplied as the input voltages VI_1 to VI_N, the differential current at the node n11 increases and the differential current at the node n12 decreases. Thereby, the voltage at the node n5 of the cascode current mirror circuit 30 decreases due to an increase in the differential current flowing out to the node n11, and the current flowing from the transistor 134 to the node n1 decreases due to this effect. On the other hand, the cascode current mirror circuit 40 extracts the folded current of the constant current of the current source 55 from the node n3. At this time, the current extracted from the node n3 is greater than the current flowing into the node n1, so the voltage PG at the node n1 and the voltage NG at the node n3 with the floating current source 60 in between are respectively lower than the stable output state. Thereby, in the output stage 15_2, an output current (charge current) flows from the power supply voltage E3 to the output terminal 3 by the transistor 171, and the output voltage signal Vout of the output terminal 3 rises. As the output voltage signal Vout rises, the difference between the differential currents at the nodes n11 and n12 decreases, and when the output voltage signal Vout changes to a voltage that satisfies equation (2), the stable output state is reached again.

On the other hand, in the case where the voltage VA or VB lower than the voltage in the stable output state is supplied as the input voltages VI_1 to VI_N, the differential current at the node n11 decreases and the differential current at the node n12 increases. Thereby, the voltage at the node n5 of the cascode current mirror circuit 30 increases due to a decrease in the differential current flowing to the node n11, and the current flowing from the transistor 134 to the node n1 increases due to this effect. On the other hand, the cascode current mirror circuit 40 extracts the folded current of the constant current of the current source 55 from the node n3, but since the current flowing into the node n1 is greater, the voltage PG at the node n1 and the voltage NG at the node n3 with the floating current source 60 in between rise from the stable output state, respectively. Thereby, in the output stage 15_2, an output current (discharge current) flows from the output terminal 3 to the power supply voltage E4 by the transistor 172, and the output voltage signal Vout of the output terminal 3 decreases. As the output voltage signal Vout decreases, the difference between the differential currents at the nodes n11 and n12 decreases, and when the output voltage signal Vout changes to a voltage that satisfies equation (2), the stable output state is reached again.

Further, in the case where one of the voltages VA and VB higher than the voltage in the stable output state is supplied as the input voltage VI_P in a predetermined voltage range in which the P-channel differential stage is operable, the differential current at the node n21 decreases and the differential current at the node n22 increases. Thereby, the voltage at the node n7 of the cascode current mirror circuit 40 decreases due to a decrease in the differential current flowing from the node n21, and the current extracted by the transistor 144 from the node n3 increases due to this effect. On the other hand, the cascode current mirror circuit 30 supplies the folded current of the constant current of the current source 55 to the node n1, but since the current extracted from the node n3 is greater, the voltage PG at the node n1 and the voltage NG at the node n3 with the floating current source 60 in between are respectively lower than the stable output state. Thereby, in the output stage 15_2, an output current (charge current) flows from the power supply voltage E3 to the output terminal 3 by the transistor 171, and when the output voltage signal Vout of the output terminal 3 rises to a voltage that satisfies equation (3), the stable output state is reached again.

On the other hand, in the case where one of the voltages VA and VB lower than the voltage in the stable output state is supplied as the input voltage VI_P, the differential current at the node n21 increases and the differential current at the node n22 decreases. Thereby, the voltage at the node n7 of the cascode current mirror circuit 40 increases due to an increase in the differential current flowing from the node n21, and the current extracted by the transistor 144 from the node n3 decreases due to this effect. On the other hand, the cascode current mirror circuit 30 supplies the folded current of the constant current of the current source 55 to the node n1. Since the current flowing into the node n1 is greater than the current extracted from the node n3, the voltage PG at the node n1 and the voltage NG at the node n3 with the floating current source 60 in between rise from the stable output state, respectively. Thereby, in the output stage 15_2, an output current (discharge current) flows from the output terminal 3 to the power supply voltage E4 by the transistor 172, and when the output voltage signal Vout of the output terminal 3 drops to a voltage that satisfies equation (3), the stable output state is reached again.

With such a configuration, in the output amplification stage 15, first, the cascode current mirror circuits 30 and 40 convert the difference between the currents that the differential stages 11_1 to 11_N respectively flow to the nodes n11 and n12 according to the input voltages VI_1 to VI_N, or the difference between the currents that the differential stage 12_1 respectively flows to the nodes n21 and n22 according to the input voltage VI_P into the voltage (PG, NG). Then, the transistors 171 and 172 cause the output current corresponding to the voltage (PG, NG) to flow to the output terminal 3. Thereby, the voltage generated at the output terminal 3 is output as the output voltage signal Vout having one of the voltage levels obtained by dividing the voltage between the voltages VA and VB into N (a power of 2) levels. At this time, as described above, the output voltage signal Vout is fed back to the inverting input terminals of the N-channel type differential stages (11_1 to 11_N) and the P-channel type differential stages (12_1, 12_2, or 12_3).

It should be noted that the internal configuration of the output amplification stage 15 is not limited to the circuit shown in FIG. 8. In other words, it suffices if the output amplification stage 15 is a circuit that realizes the operation of outputting, as the output voltage signal Vout, the voltage generated at the output terminal 3 by causing an output current corresponding to the difference between the currents respectively flowing to the nodes n11 and n12, or the difference between the currents respectively flowing to the nodes n21 and n22 to flow to the output terminal 3.

Moreover, in the above-mentioned DA converter 100_1, 100_2, or 100_3, the N systems of differential stages 11_1 to 11_N are N-channel type differential stages and the single differential stage 12_1 (or 12_2 or 12_3) is a P-channel type differential stage, but the differential stages 11_1 to 11_N may be P-channel type differential stages and the single differential stage 12_1 (or 12_2 or 12_3) may be an N-channel type differential stage. In other words, the differential stages 11_1 to 11_N may be of the first conductivity type and the single differential stage 12_1 (or 12_2 or 12_3) may be of the second conductivity type, which is the opposite conductivity type to the first conductivity type.

In short, the DA converter according to the disclosure may include the decoder and the differential amplifier circuit described below.

The decoder (50S_2) selects two voltages including overlap from a plurality of reference voltages (V0 to VR) as the first voltage (VA) and the second voltage (VB) based on the digital data (DT).

The differential amplifier circuit (10_1 to 10_3) outputs a signal, which has one voltage value corresponding to the digital data (DT) among the voltage values obtained by dividing the voltage between the first voltage (VA) and the second voltage (VB) into N (N is a natural number expressed as a power of 2), as the output voltage signal (Vout).

Here, the differential amplifier circuit includes the first to $N^{th}$ differential stages of the first conductivity type, the single differential stage of the second conductivity type, and the output amplification stage described below.

The first to $N^{th}$ differential stages (11_1 to 11_N) of the first conductivity type each receive the first or second voltage (VA, VB) at its own non-inverting input terminal and cause a differential current corresponding to the first or second voltage to flow to the first node (n11), and receive the output voltage signal (Vout) at its own inverting input terminal and cause a differential current corresponding to the output voltage signal (Vout) to flow to the second node (n12).

The differential stage (12_1 to 12_3) of the second conductivity type receives one voltage of the first voltage (VA) and the second voltage (VB) at its own non-inverting input terminal and receives the output voltage signal (Vout) at its own inverting input terminal. At this time, the differential stage (12_1 to 12_3) of the second conductivity type is activated in the case where the digital value (for example, gradation level) indicated by the digital data (DT) is included in a predetermined range, and causes a differential current corresponding to one voltage (VA or VB) received at its own non-inverting input terminal to flow to the third node (n21) and causes a differential current corresponding to the output voltage signal (Vout) received at its own inverting input terminal to flow to the fourth node (n22).

The output amplification stage (15) outputs, as the output voltage signal (Vout), the voltage generated at the output terminal by flowing an output current corresponding to the difference between the currents respectively flowing to the first and second nodes (n11, n12), or the difference between the currents respectively flowing to the third and fourth nodes (n21, n22) to the output terminal (3).

Sixth Embodiment

Figure 9:
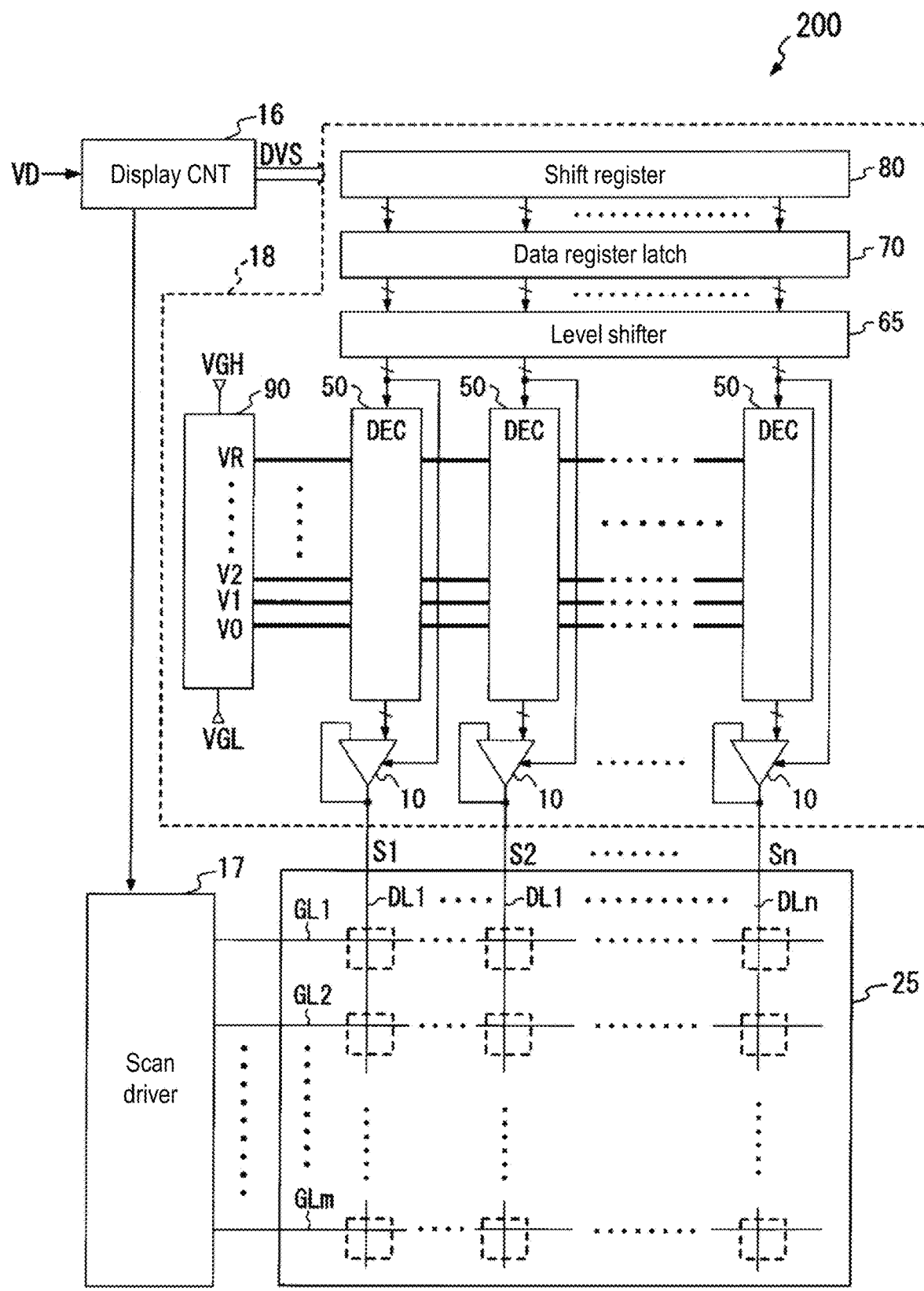
FIG. 9 is a block diagram showing the schematic configuration of the display device 200 including the data driver according to the disclosure.

FIG. 9 is a block diagram showing the configuration of a display device 200 having a data driver including the above-described DA converter (100_1 to 100_3).

The display device 200 includes a display panel 25, a display controller 16 (display CNT), a scan driver 17, and a data driver 18.

The display panel 25 is composed of, for example, a liquid crystal panel or an organic EL panel, and includes m horizontal scan lines GL1 to GLm (m is a natural number of 2 or more) extending in the horizontal direction of a two-dimensional screen, and n data lines DL1 to DLn (n is a natural number of 2 or more) extending in the vertical direction of the two-dimensional screen. A display cell serving as a pixel is formed at each intersection of the horizontal scan lines and the data lines.

Based on a video signal VD, the display controller 16 generates a video digital signal DVS that includes various control signals, such as a start pulse, a clock signal, vertical and horizontal synchronization signals, and a series of video digital data pieces representing the brightness level of each pixel.

The display controller 16 generates a scan timing signal corresponding to the above horizontal synchronization signal and supplies the scan timing signal to the scan driver 17, and supplies the above video digital signal DVS to the data driver 18.

In addition, the display controller 16 may be built into the data driver 18.

The scan driver 17 sequentially applies a horizontal scan pulse to each of the horizontal scan lines GL1 to GLm of the display panel 15 based on the scan timing signal supplied from the display controller 16. In addition, the scan driver 17 may be formed by a thin film transistor circuit at the end of the display panel 25.

The data driver 18 includes a shift register 80, a data register latch 70, a level shifter 65, a reference voltage generation circuit 90, n decoders 50, and n differential amplifier circuits 10.

The shift register 80 generates a plurality of latch timing signals for selecting a latch in synchronization with the clock signal in response to the start pulse included in the video digital signal DVS, and supplies the latch timing signals to the data register latch 70.

Based on each of the latch timing signals supplied from the shift register 80, the data register latch 70 captures the video digital data pieces included in the video digital signal DVS every predetermined number (for example, n pieces), and supplies n video digital data signals representing each video digital data piece to the level shifter 65.

The level shifter 65 applies level shifting processing to each of the n video digital data signals supplied from the data register latch 70 to increase the signal amplitude thereof, and supplies the obtained n level-shifted video digital data signals respectively to the n decoders 50 that are provided respectively corresponding to n output channels of the data driver 18.

The reference voltage generation circuit 90 receives a DC reference power supply voltage VGH and a reference power supply voltage VGL lower than the reference power supply voltage VGH. The reference voltage generation circuit 90 generates reference voltages V0 to VR having different voltage values based on the reference power supply voltages VGH and VGL, and supplies the reference voltages V0 to VR to each of the n decoders 50.

Each of the decoders 50 selects a pair of reference voltages corresponding to the video digital data signal level-shifted by the level shifter 65 from the reference voltage group described above. Then, each of the decoders 50 supplies the selected pair of reference voltages, as two voltages (VA, VB), to the differential amplifier circuits 10 provided corresponding to the n output channels of the data driver 18, respectively.

The differential amplifier circuit 10 generates the output voltage signal Vout having one of, for example, 8 levels of voltage that divides between the input voltages VA and VB, and outputs this output voltage signal Vout as a drive signal. At this time, the n drive signals output from the n differential amplifier circuits 10 are respectively supplied to the data lines DL1 to DLn of the display panel 25 as drive signals S1 to Sn.

Here, the DA converter 100_1, 100_2, or 100_3 shown in FIG. 2, FIG. 5, or FIG. 6 is used as the decoder 50 and the differential amplifier circuit 10 provided for each output channel of the data driver 18 shown in FIG. 9 and as the reference voltage generation circuit 90. For example, the decoder 50_1 or 50_2 shown in FIG. 2, FIG. 5, or FIG. 6 is used as the decoder 50 shown in FIG. 9. Further, the P-channel differential stage control circuit 51 or 52 and the differential amplifier circuit 10_1, 10_2, or 10_3 shown in FIG. 2, FIG. 5, or FIG. 6 are used as the differential amplifier circuit 10. Thereby, it is possible to save the area of the data driver 18.

What is claimed is:

1. A digital-to-analog converter, configured to convert digital data into an analog output voltage signal, the digital-to-analog converter comprising:
    a decoder selecting two voltages including overlap from a plurality of reference voltages as a first voltage and a second voltage, based on the digital data; and
    a differential amplifier circuit outputting a signal, which has one voltage value corresponding to the digital data among voltage values obtained by dividing a voltage between the first voltage and the second voltage into N (N is a natural number expressed as a power of 2), as the output voltage signal,
    wherein the differential amplifier circuit comprises:
    first to $N^{th}$ differential stages of a first conductivity type each receiving the first voltage or the second voltage at a non-inverting input terminal thereof to cause a differential current corresponding to the first voltage or the second voltage to flow to a first node, and receiving the output voltage signal at an inverting input terminal thereof to cause a differential current corresponding to the output voltage signal to flow to a second node;
    a single differential stage of a second conductivity type receiving one voltage of the first voltage and the second voltage at a non-inverting input terminal thereof and receiving the output voltage signal at an inverting input terminal thereof, and being activated in a case where a digital value indicated by the digital data is included in a predetermined range to cause a differential current corresponding to the one voltage received at the non-inverting input terminal thereof to flow to a third node and cause a differential current corresponding to the output voltage signal received at the inverting input terminal thereof to flow to a fourth node; and
    an output amplification stage outputting, as the output voltage signal, a voltage generated at an output terminal by causing an output current corresponding to a difference between the differential currents respectively flowing to the first node and the second node, or a difference between the differential currents respectively flowing to the third node and the fourth node to the output terminal.

2. The digital-to-analog converter according to claim 1, further comprising:
    a differential stage control circuit supplying to the differential stage of the second conductivity type a control signal that instructs activation in a case where the digital value indicated by the digital data is included in the predetermined range, and instructs deactivation in a case where the digital value is not included in the predetermined range,
    wherein the differential stage of the second conductivity type is activated in a case of receiving the control signal that instructs the activation, and is deactivated in a case of receiving the control signal that instructs the deactivation and stops currents flowing to the third node and the fourth node.

3. The digital-to-analog converter according to claim 2, wherein each of the first to $N^{th}$ differential stages of the first conductivity type comprises a pair of transistors of the first conductivity type having gates respectively serving as the non-inverting input terminal thereof and the inverting input terminal thereof, and
    the predetermined range includes a range of the digital value indicating the digital data where a voltage value of at least one voltage of the first voltage and the second voltage selected by the decoder based on the digital value indicating the digital data is lower than a threshold voltage of the transistors of the first conductivity type.

4. The digital-to-analog converter according to claim 2, wherein a range of voltage of the output voltage signal comprises:
    a first section composed of a voltage range corresponding to the predetermined range; and
    a second section adjacent to the first section,
    wherein in the second section, the differential stage of the second conductivity type is deactivated, and the output voltage signal is generated by operations of the first to $N^{th}$ differential stages of the first conductivity type, and
    in the first section, the differential stage of the second conductivity type is activated, and the output voltage signal is generated by an operation of the differential stage of the second conductivity type.

5. The digital-to-analog converter according to claim 2, wherein the differential stage of the second conductivity type comprises:
    first and second transistors of the second conductivity type;
    a current source; and
    a switch element that is turned on in a case where the control signal instructs the activation to connect the current source and sources of the first and second transistors, and is turned off in a case where the control signal instructs the deactivation to cut off connection between the current source and the sources of the first and second transistors.

6. The digital-to-analog converter according to claim 2, wherein the differential stage of the second conductivity type comprises:
    first and second transistors of the second conductivity type;
    a current source that is connected to sources of the first and second transistors;
    a first switch element that is connected between a drain of the first transistor and the third node; and
    a second switch element that is connected between a drain of the second transistor and the fourth node,
    wherein the first switch element and the second switch element are both turned on in a case where the control signal instructs the activation to connect the drain of the first transistor to the third node and connect the drain of the second transistor to the fourth node, and are both turned off in a case where the control signal instructs the deactivation to cut off connection between the drain of the first transistor and the third node and connection between the drain of the second transistor and the fourth node.

7. The digital-to-analog converter according to claim 2, wherein the differential stage of the second conductivity type comprises:
   a first switch element connected between the inverting input terminal and the output terminal thereof; and
   a second switch element connected between the inverting input terminal and the non-inverting input terminal thereof,
   wherein the first switch element is turned on and the second switch element is turned off in a case where the control signal instructs the activation so that the differential stage of the second conductivity type is activated, and the first switch element is turned off and the second switch element is turned on in a case where the control signal instructs the deactivation so that the differential stage of the second conductivity type is deactivated.

8. The digital-to-analog converter according to claim 7, wherein in a case of instructing the deactivation, the differential stage control circuit supplies a predetermined reference voltage, which has a voltage value that turns off first and second transistors of the differential stage of the second conductivity type, among the plurality of reference voltages to the non-inverting input terminal and the inverting input terminal of the differential stage of the second conductivity type.

9. The digital-to-analog converter according to claim 1, wherein a range of voltage of the output voltage signal comprises:

a first section composed of a voltage range corresponding to the predetermined range; and
a second section adjacent to the first section,
wherein in the second section, the differential stage of the second conductivity type is deactivated, and the output voltage signal is generated by operations of the first to $N^{th}$ differential stages of the first conductivity type, and
in the first section, the differential stage of the second conductivity type is activated, and the output voltage signal is generated by an operation of the differential stage of the second conductivity type.

10. A data driver, comprising a plurality of the digital-to-analog converters according to claim 1, the data driver being configured to convert each video digital data piece representing a brightness level of each pixel as a digital value into a plurality of output voltage signals including the output voltage signal each having an analog voltage value by the plurality of digital-to-analog converters, and respectively supply a plurality of drive signals respectively having the plurality of output voltage signals to a plurality of data lines of a display panel.

11. A display device, comprising:
   a display panel comprising a plurality of data lines to which a plurality of display cells are respectively connected; and
   a data driver comprising the digital-to-analog converter according to claim 1, which is one of a plurality of digital-to-analog converters and configured to convert each video digital data piece representing a brightness level of each pixel as a digital value into a plurality of output voltage signals including the output voltage signal each having an analog voltage value by the plurality of digital-to-analog converters, and respectively supply a plurality of drive signals respectively having the plurality of output voltage signals to the plurality of data lines of the display panel.

* * * * *